United States Patent [19]

Restall, deceased

[11] Patent Number: 5,126,213

[45] Date of Patent: Jun. 30, 1992

[54] COATED NEAR-ALPHA TITANIUM ARTICLES

[75] Inventor: James E. Restall, deceased, late of Camberley, England, by Janet Elizabeth Restall, executrix

[73] Assignee: The Secretary of State for Defence in Her Britannic Majesty's Government of the United Kingdom of Great Britain and Northern Ireland, London, England

[21] Appl. No.: 435,399

[22] PCT Filed: May 17, 1988

[86] PCT No.: PCT/GB88/00390

§ 371 Date: Oct. 31, 1989

§ 102(e) Date: Oct. 31, 1989

[87] PCT Pub. No.: WO88/09397

PCT Pub. Date: Dec. 1, 1988

[30] Foreign Application Priority Data

May 18, 1987 [GB] United Kingdom ............... 8711698

[51] Int. Cl.⁵ .................................................. B32B 15/00
[52] U.S. Cl. ..................................... 428/660; 428/680
[58] Field of Search ............... 428/660, 661, 666, 680; 148/421

[56] References Cited

U.S. PATENT DOCUMENTS

| | | | |
|---|---|---|---|
| 2,858,600 | 11/1958 | Vigor | 428/660 |
| 2,900,715 | 8/1959 | Milnes | 428/660 |
| 3,268,306 | 8/1966 | Jeffreys | 428/660 |
| 3,471,342 | 10/1969 | Wood | 428/661 |
| 3,560,274 | 2/1971 | Ogden | 428/661 |
| 3,691,029 | 9/1972 | Raymond et al. | 425/660 |
| 3,713,901 | 1/1973 | Blumenthal et al. | 428/661 |
| 3,754,903 | 8/1973 | Goward et al. | 75/171 |
| 3,756,193 | 9/1973 | Carmichael et al. | 118/49.1 |
| 3,813,258 | 5/1974 | Pieper et al. | 428/661 |
| 4,034,142 | 7/1977 | Hecht | 428/678 |
| 4,137,370 | 1/1979 | Fujishiro et al. | 428/660 |
| 4,273,824 | 6/1981 | McComas et al. | 428/661 |
| 4,305,998 | 12/1981 | Manty et al. | 428/661 |
| 4,496,635 | 1/1985 | Wang et al. | 428/680 |

FOREIGN PATENT DOCUMENTS

| | | | |
|---|---|---|---|
| 81170 | 6/1983 | European Pat. Off. | |
| 188057 | 7/1986 | European Pat. Off. | 428/660 |
| 207768 | 1/1987 | European Pat. Off. | |
| 2277902 | 2/1976 | France | |
| 56-72167 | 6/1981 | Japan | 428/660 |
| 56-81665 | 7/1981 | Japan | 428/660 |
| 58-77586 | 5/1983 | Japan | 428/660 |
| 58-111917 | 7/1983 | Japan | 428/661 |
| 749365 | 5/1952 | United Kingdom | |
| 1498866 | 1/1978 | United Kingdom | |

OTHER PUBLICATIONS

Thin Solid Films, vol. 63, No. 1, Oct. 1979 Elsevier Sequoia S.A. Lausanne (CH) F. Fujishiro et al.: "Creep Property Improvement of $\alpha + \beta$ Titanium Alloys by Platinum Ion Plating", pp. 55–60.

Thin Solid Films, vol. 45, 1977 Elsevier Sequoia S.A. Lausanne (CH) D. G. Teer et al.: "The Formation of Low Friction Wear-Resistant Surfaces on Titanium by Ion Plating" pp. 583–589.

Primary Examiner—John J. Zimmerman

[57] ABSTRACT

Articles of titanium based materials are protected against alpha case formation such as results from exposure to air at high temperatures coating with a nickel-chromium based alloy. The coating may be deposited by ion plating, sputter plating or sputter ion plating these methods being preferred for avoidance of surface contamination. A preferred nickel to chromium ratio (by weight) is 18:1 to 1.5:1. Specific coating compositions are: a) Nimonic 75 (trade name) a 20 percent chromium 80 percent nickel (by weight) based alloy; and b) Ni-35Cr-8Al-8Si (by weight).

8 Claims, 5 Drawing Sheets

80 Ni-20Cr COATING

80 Ni-20Cr COATING

80 Ni-20Cr COATING

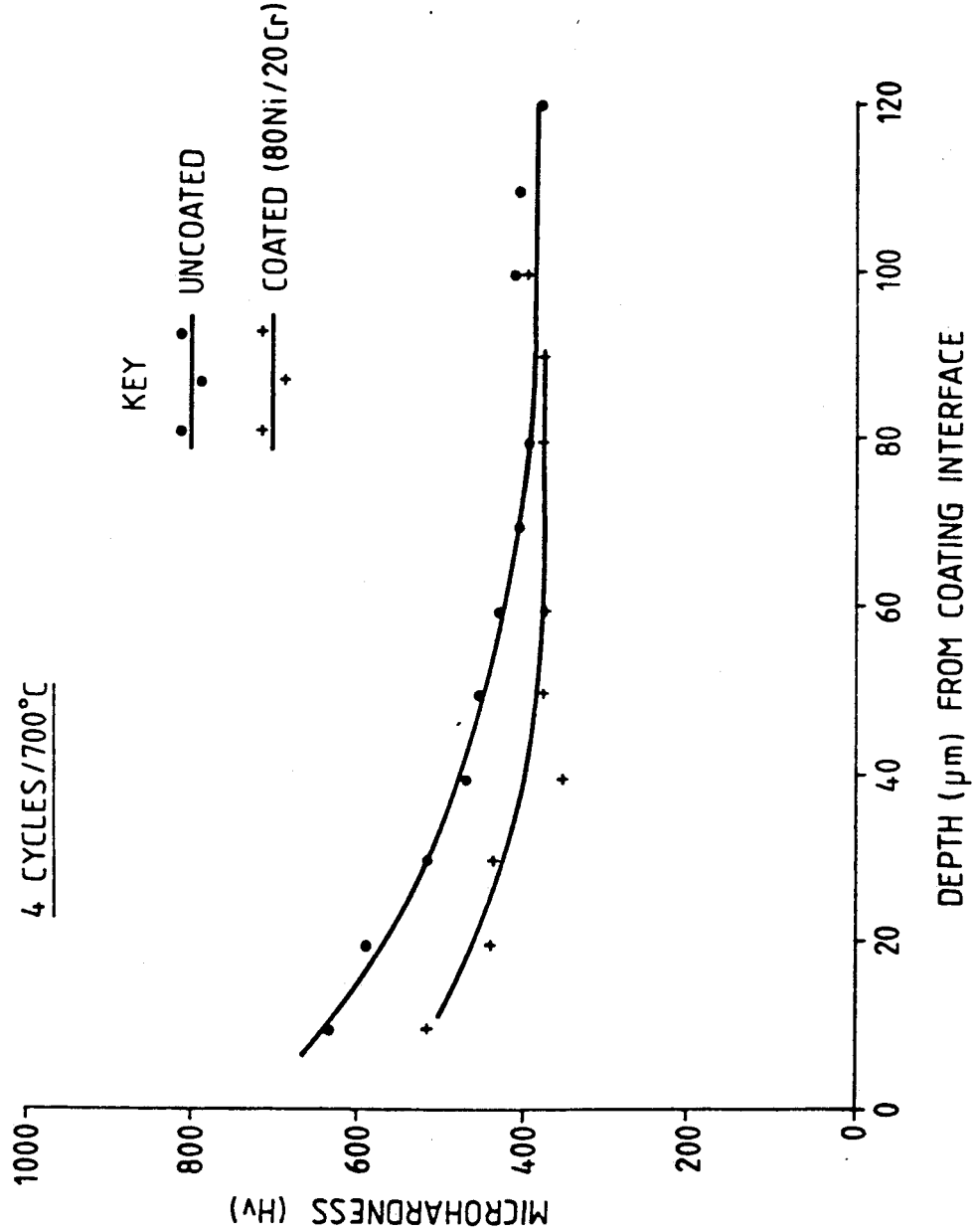

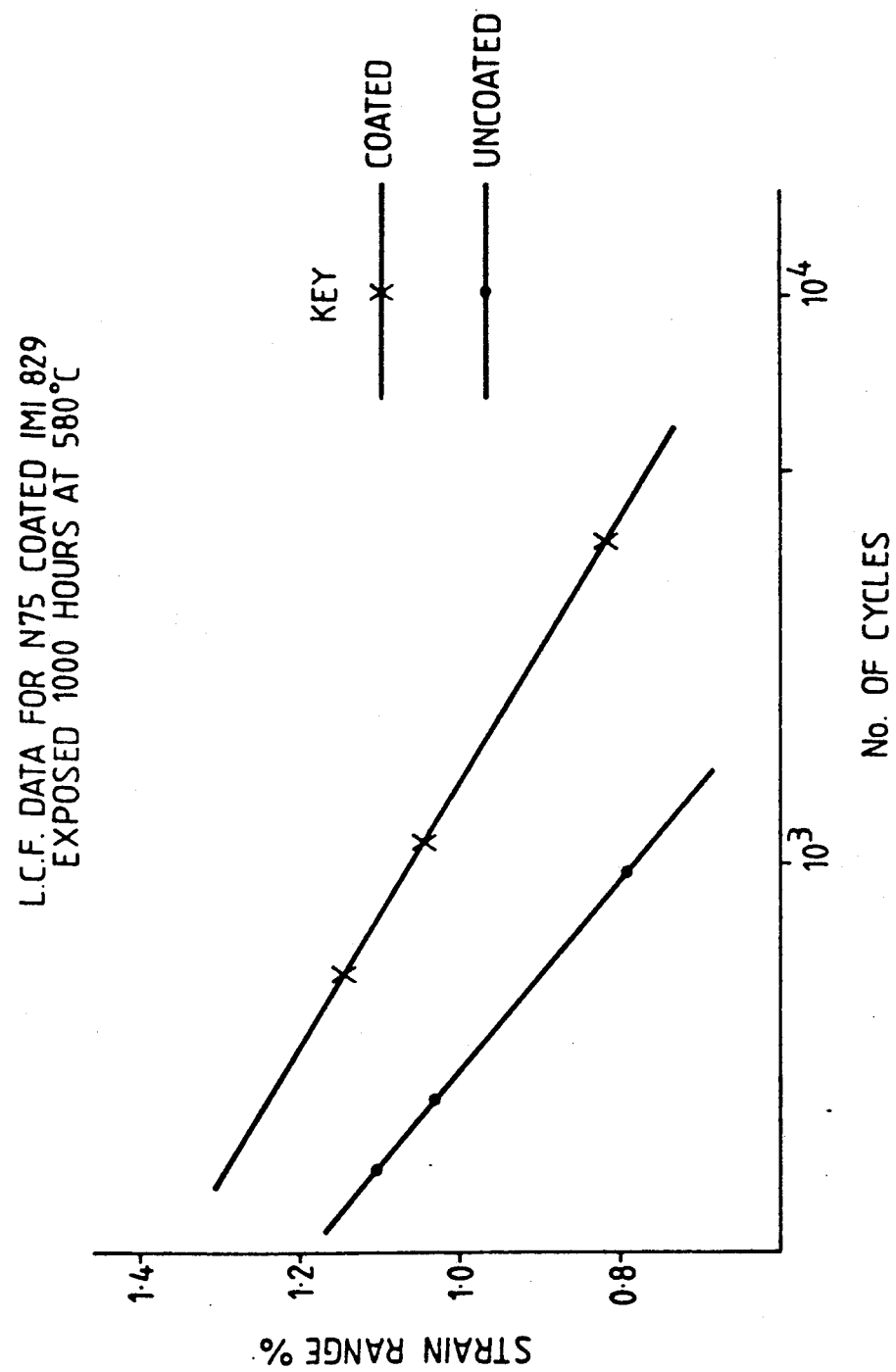
Fig.6 L.C.F. DATA FOR N75 COATED IMI 829 EXPOSED 1000 HOURS AT 580°C

COATED NEAR-ALPHA TITANIUM ARTICLES

This invention relates to protective coatings for articles of near $-\alpha$ titanium based alloys. It is particularly concerned with coatings for gas turbine engine compressor stage components formed in near $-\alpha$ titanium based alloys suitable to convey at least high temperature oxidation resistance and preferably also high temperature corrosion resistance to these components.

Pure titanium undergoes an allotropic transformation at 882° C. from the lower temperature phase, designated the $\alpha$ phase, which has a hexagonal close-packed (hcp) structure to a higher temperature phase, designated the $\beta$ phase, which is stable up to the melting temperature and has a body centre cubic structure. Titanium alloys are conventionally categorised as $\alpha$-type alloys, $\beta$-type alloys or $\alpha + \beta$ alloys by virtue of the nature and level of the alloying additions they contain. Near $-\alpha$ titanium alloys are titanium based with additions of, amongst other things, $\alpha$-stabilising elements such as aluminium and tin that promote the hexagonal close packed structure of the $\alpha$-phase. The $\alpha$-phase has very good high temperature creep properties and in near $-\alpha$ titanium alloys these good creep properties are achieved while still maintaining adequate low temperature strength and forgeability.

This excellent balance of strength, ductility, microstructural stability and oxidation/corrosion resistance as compared with competitive materials such as steels or nickel based superalloys has resulted in near $-\alpha$ titanium alloys becoming increasingly important as constructional material for compressor components in advanced gas turbine engines.

A wide variety of these high strength near $-\alpha$ titanium alloys have been developed commercially to tolerate operating conditions involving prolonged exposure to air at temperatures up to 500° C. The following commercial alloys of IMI Titanium Ltd (identified by their commercial designation and nominal composition in weight percent) are typical of the current generation of titanium alloys suitable for gas turbine compressor applications. These are: IMI 550 (Ti-4Al-2Sn-4Mo-0.5Si); IMI 679 (Ti-11Sn-2.25Al-5Zr-1Mo-0.25Si); IMI 685 (Ti-6Al-5Zr-0.5Mo-0.25Si) IMI 829 (Ti-5.5Al-3.5Sn-3Zr-0.25M-0.3Si) and IMI 834 (Ti-5.8Al-3.5Zr-0.7Nb-0.5Mo-0.06C).

There is continuing commercial interest in increasing the temperature tolerance of near $-\alpha$ titanium alloys in order that gas turbine engine cycle temperatures can be raised to increase engine efficiency without recourse to other materials. There is also the possibility that an increase in temperature tolerance might permit these titanium alloys to be used for components currently made of say nickel-based superalloys with consequent reduction in component weight. Some of the conventional near $-\alpha$ titanium alloys exhibit excellent creep resistance and good structural stability at temperatures significantly above the 500° C. mentioned earlier—say to 650° C. However, when such alloys are exposed to air at temperatures approaching 600° C. they are subject to significant and detrimental surface modification. The principal factor involved in this surface modification is the uptake of oxygen into solid solution by the titanium. At these temperatures the reaction kinetics ensure rapid diffusion of oxygen into the region adjacent the exposed surface. Approximately 30 atomic percent may be dissolved in the titanium. The dissolved oxygen creates in the affected region a hard brittle zone. The affected zone is called the alpha case and its formation can substantially degrade the structural integrity of the affected article by loss of tensile ductility and of fatigue resistance even though the interior of the article is not subject to structural modification. Nitrogen plays some part in the degradation process which occurs but the predominant factors in alpha case formation are the presence of oxygen, the exposure time and the temperature. The terms "oxidation", "oxidation resistance" and related terms are hereinafter intended to encompass both oxygen and nitrogen effects; the terms being used to distinguish these effects from other forms of attack both chemical—such as aqueous corrosion and high temperature sulphidation or alkali metal salt corrosion and non-chemical attack by erosion. Corrosion can be a life limiting factor under some circumstances for example gas turbine components for aircraft that fly at low altitudes across the sea in high salt environments. It is desirable therefore, that a coating can also convey some degree of protection against corrosion attack.

The phenomenon of high temperature oxidation in titanium and titanium based alloys is not new-found and attempts have already been made to overcome this. One approach to this is to vary the alloy composition in such a way as to convey adequate intrinsic resistance. However, all alloy compositions represent an optimisation of conflicting requirements and it is quite likely that such titanium alloy compositions as could be produced to solve the oxidation problem would be deficient in other respects. The aforementioned present generation titanium alloys especially IMI 829, IMI 834 and other near $-\alpha$ titanium alloys are well established in the art and would be suitable for higher temperature applications if adequately protected against high temperature oxidation.

Although protective coatings are well established and widely used for the corrosion/oxidation protection of the nickel-based superalloys used in the hot sections of the turbine stage, oxidation protective coatings are not yet well established for titanium compressor components.

There are special difficulties involved in providing a coating that is resistant to high temperature degradation, impervious to oxygen, adheres securely to the near $-\alpha$ titanium substrate and can be deposited by a process that does not impair the properties of the substrate.

Plasma spraying conventionally used in coating a wide variety of materials such as nickel based superalloys, deposits coatings that are characteristically porous and internally stressed and consequently require substantial post deposition treatment to form an oxidation resistant coating. The heat treatments necessarily involved will often be at temperatures that reverse properties carefully secured in the near $-\alpha$ titanium alloys through prior heat treatment at temperatures typically in the region of 1000-1100° C. We believe plasma spraying will be inappropriate for coating near $-\alpha$ titanium alloy substrates for this reason.

It is known that surface enrichment of $\alpha/\beta$ titanium alloys with platinum improves the oxidation resistance (as measured by fatigue properties) at temperatures up to 450° C. but the published work on this does not suggest any improvement in oxidation resistance at higher temperatures nor is such an improvement suggested by the Applicant's experiments with platinum enrichment. The Applicant has found also that only marginal improvement in high temperature oxidation resistance is secured by coating with gold, or nickel, or chromium or platinum overlaid with nickel, these being deposited by a sputter ion plating method.

Aluminide coatings and chromised coatings are well known in the protection of nickel based superalloys. These are produced either by deposition of pure metal by cementation or chemical vapour deposition followed by heat treatment to form the intermetallic compound, or alternatively by physical vapour deposition of the intermetallic. Such coatings are not suitable for conveying high temperature oxidation resistance to titanium or titanium alloy as they form brittle intermetallic phases at the interface with the parent material which renders the coating susceptible to spallation damage, particularly when subject to thermal cycling. Moreover the deposition temperature of 750° C. or more required for cementation or chemical vapour deposition processes would unacceptably degrade the properties of a near $-\alpha$ titanium alloy component.

Chemical routes generally such as chemical vapour deposition tend not to be suitable for coating near $-\alpha$ titanium alloys, as surface cleanliness and contamination are very important. Both halide and carbonyl atmospheres used in such processes, along with the temperatures needed for deposition make it difficult to clean the surface to prevent contaminants being introduced that can impair adhesion. Contamination at the coating stage can also lead to the formation of an embritted layer within the substrate below the coating which is detrimental to the substrate in itself and is detrimental also to the durability of the coating. Halide contamination can lead to the formation of such embrittled layers as well as oxygen contamination which is a particular problem because of the high solubility of oxygen in titanium.

SUMMARY OF THE INVENTION

The aim of this invention is to provide an oxidation resistant coating for the protection of near $-\alpha$ titanium alloys to increase the temperature to which such alloys suitably coated can be operational in gas turbine engine compressor applications. To achieve this aim a coating must protect the substrate against the loss of fatigue resistance, toughness and ductility due to oxidation that will prevent near $-\alpha$ titanium alloys being used for components with an operational temperature much in excess of 600° C. Recently developed near $-\alpha$ titanium alloys exhibit the creep resistance and structural stability necessary to withstand repeated excursions to well above 600° C. Suitable coatings to protect components such as gas turbine engine compressor components from oxidation and/or corrosion would enable the high temperature mechanical properties of near $-\alpha$ titanium alloys to be utilised by increasing operational temperatures to well above 600° C.

The invention is an article comprising a near $-\alpha$ titanium based alloy when coated with a high temperature oxidation and or corrosion resistance coating, the coating being applied by a process selected from the group consisting of ion plating, sputter plating and sputter ion plating and comprising a nickel-chromium based alloy wherein the nickel and chromium in combination constitute at least 75% by weight of the applied coating with a ratio of nickel to chromium in the range 18:1 to 1.5:1 by weight. This corresponds to a chromium range of 5 to 40 weight percent in the binary material.

The article may be wholly metal or a reinforced metal such as a metal matrix composite. The coatings of this invention possess good intrinsic resistance to high temperature oxidation and low permeability to oxygen and nitrogen whilst possessing other attributes which are desirable such as resistance to spallation when thermally cycled, and interface ductility consequent upon the formation of ductile titanium-nickel intermetallic phases. There is some mismatch between the coefficient of expansion of the coating and titanium based substrates but this is not so great as to present a problem.

The coating may contain other elements in addition to the nickel-chromium base, but preferably retains a nickel to chromium ratio within the aforementioned range. To promote a film of stable aluminium oxide at the exposed surface of the coating aluminium may be included, preferably 2-12 percent by weight. Silicon may also be included to provide a harder, more erosion resistant surface. A preferable range for the silicon addition is 2-12 percent by weight. The coating may include one or more of the following ingredients in minor proportions: yttrium; boron; a precious metal (platinum, rhodium or silver); a rare earth element (lanthanum or cerium); and reactive elements such as hafnium, titanium or zirconium.

The coating may contain a minor proportion of other elements such as up to 10% iron by weight which do not contribute significantly to the effectiveness of the coating, but which might be found in commercially available materials.

The ion plating, sputter plating and sputter ion plating methods of deposition are all sub-atmospheric pressure processes which can be performed under argon cover so as to minimise the possibilities for contamination during coating. Moreover with each of these it is possible to pre clean the substrate by ion bombardment then move directly to the deposition stage. These plating processes are well established in the art so no general description of them is offered here.

Specific examples of coated titanium based components according to the invention are described below. Reference is made to uncoated titanium based components for the purpose of comparison. The comparison of coated and uncoated specimens is made with reference to the accompanying drawings.

BRIEF DESCRIPTION OF THE DRAWINGS

FIG. 5 is a graph depicting a like comparison to that of FIG. 4 but showing measurements made after a more severe oxidation test.

FIG. 6 is a graph depicting low cycle fatigue data on uncoated specimens and coated specimens which have been subjected to 1,000 hr exposure at 580° C. in air prior to testing.

DESCRIPTION OF THE PREFERRED EMBODIMENTS

Cylindrical test pins of IMI829 alloy were coated to a depth of approximately 5 μm by means of a hot rod target sputtering process using targets of Nimonic 75 alloy. Nimonic 75 is a trade designation of International Nickel for an alloy with the composition by weight percent of: 0.08-0.15C; 0.1 (max)Si; 0.5(max)Cu; 5.0(max)Fe; 0.2-0.6Ti; 18-21Cr; Ni balance. The sputtering process was of the type described by R. G. Duckworth in Proc Int Conf on Thin and Thick Film Technology, Ausbert, 1977, NTG70, VDE, Berlin 1977 pp 83-87. There are no significant differences between the sputtering coefficients of the elements in the Nimonic 75 target so the coating produced should have the same composition as the target. This composition was confirmed by microprobe analysis of the coatings.

Figure 1:
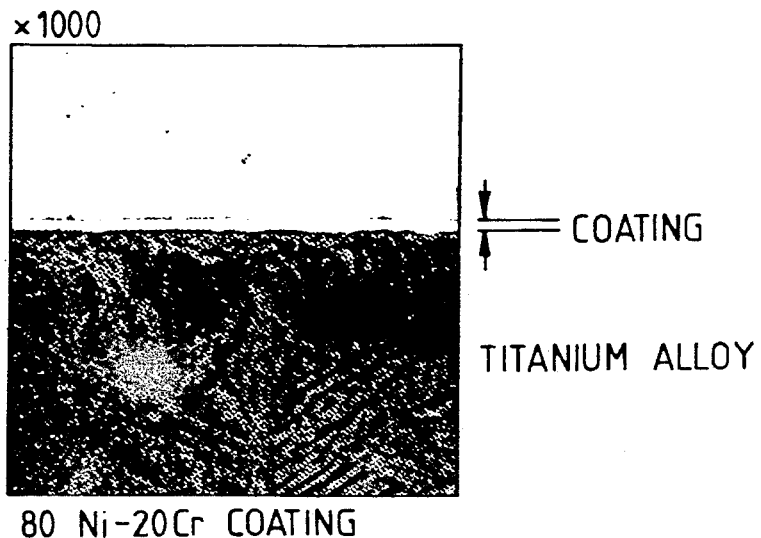
FIG. 1 is a microsection of a coated specimen in the as-coated condition.

FIG. 1 shows a microsection at ×1,000 magnification of an IMI829 test pin which has been coated as described above. It will be seen that the coating is dense and adherent. A traverse of microhardness measurements across a section as shown reveals no significant variation in hardness as would be indicative of surface contamination in the coating process.

Figure 2:
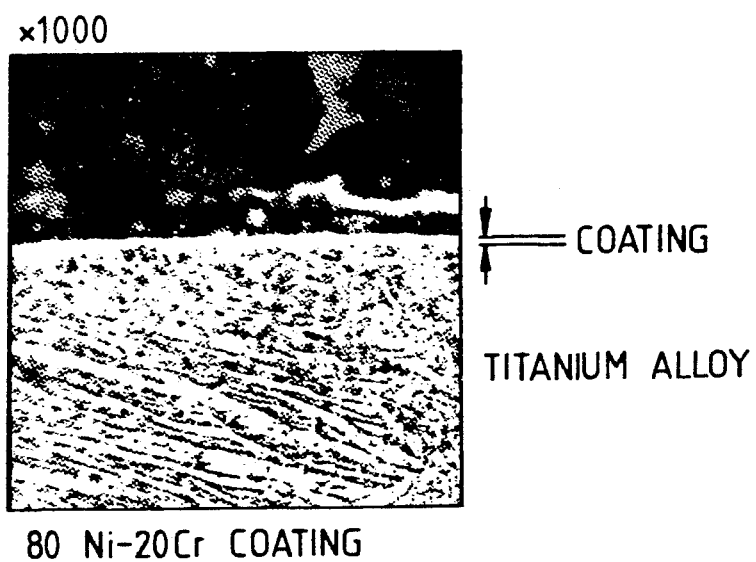
FIG. 2 is a microsection of a coated specimen which has been subjected to cyclic oxidation testing.
Figure 3:
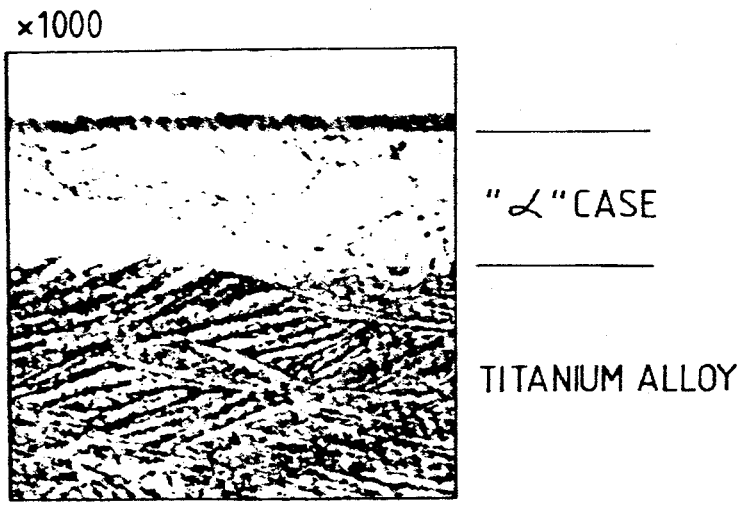
FIG. 3 is a microsection of an uncoated specimen which has been subjected to cyclic oxidation testing.

The Nimonic 75 coated test pins were subjected to cyclic oxidation testing by exposure to air in an open furnace at a furnace temperature of 650° C. Each cycle consisted of 24 hours in furnace and 1 hour out of furnace. The specimens were weighed to assess weight gain and optically examined to assess the coating condition. These tests were continued for accummulated times of several hundreds of hours. Like tests were also performed on further specimens using a furnace temperature of 700° C. for accummulated times up to 100 hours. It was found that, providing sufficient care was taken to ensure surface cleanliness at the coating stage, the adherence of the protective coating was excellent with no spallation or cracking damage at the cessation of the cyclic oxidation tests. No significant weight gain was observed. The formation of alpha case in titanium alloys is detectable by strain etching (because of changed microstructure) and also by microhardness measurements (because the alpha case is harder than the base material). FIG. 2 shows a microsection (at ×1,000 magnification) of a coated specimen after 150 hours of cyclic oxidation testing at a furnace temperature of 650° C. It will be seen that this microsection displays no significant change with respect to the pre-test specimen microsection shown in FIG. 1. FIG. 3 shows a ×1,000 microsection of an uncoated IMI829 control specimen after the same cyclic oxidation test of 150 hours at a furnace temperature of 650° C. The difference between the microsections of the coated and uncoated specimens is immediately apparent there being a significant alpha case layer present in the uncoated specimen which is absent from the coated specimen.

Figure 4:
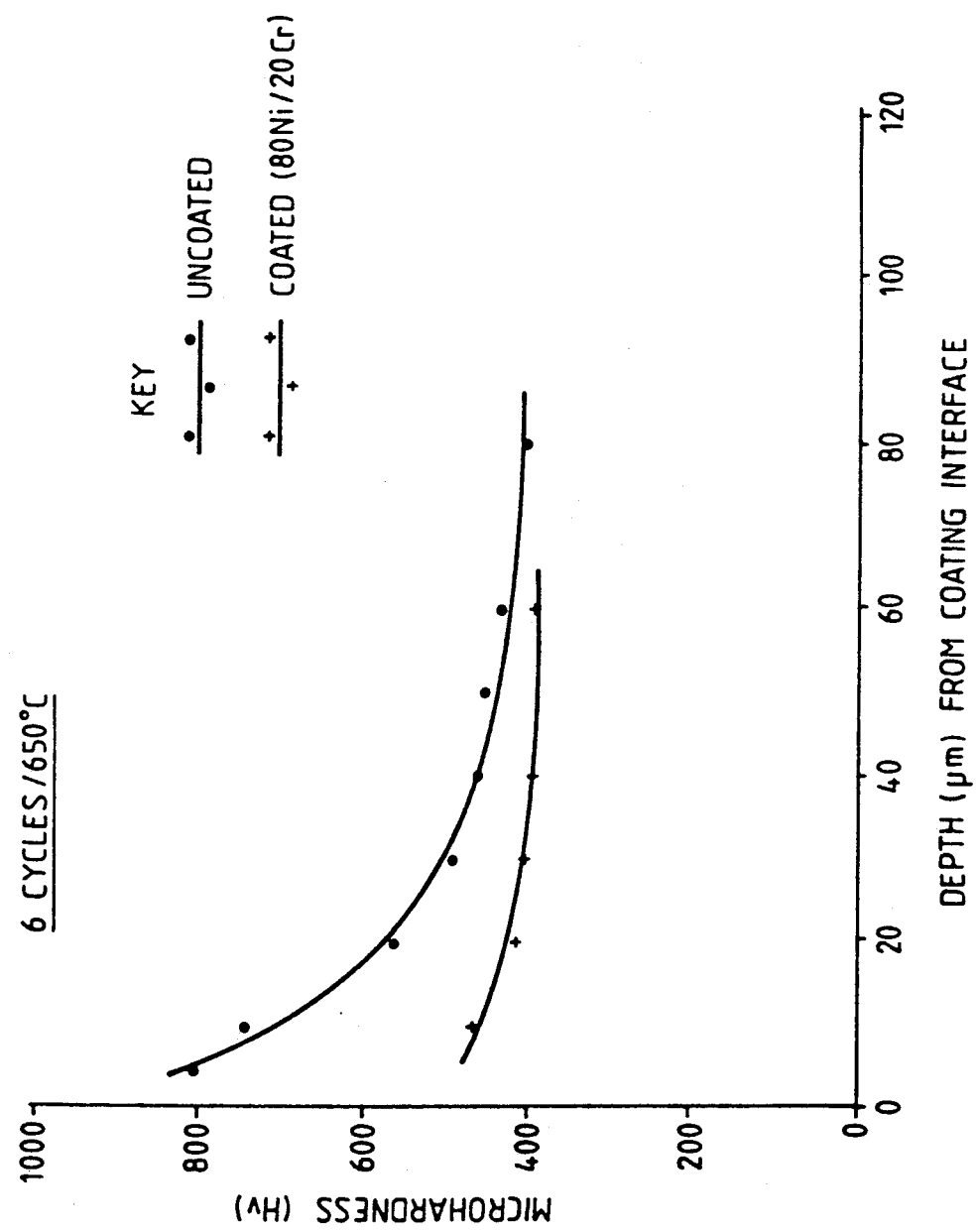
FIG. 4 is a graph depicting microstructural modification consequent upon oxidation testing, as measured by microhardness measurements on a traverse through the surface regions showing coated and uncoated specimens.

FIG. 4 compares microhardness measurements of coated and uncoated specimens after 150 hours of cyclic oxidation testing at a furnace temperature of 650° C. The uncoated specimen exhibits increased microhardness consequent upon alpha case formation to a depth of at least 60 μm. The coated specimen exhibits only a very minor change in microhardness and even this is confined to the first 20 μm. FIG. 5 gives a similar comparison of microhardness measurements but for specimens subjected to 100 hours cyclic oxidation testing at a furnace temperature of 700° C. After such testing the uncoated specimen exhibits a similar change of surface hardness to that for the longer, lower temperature test but the hardness at sub-surface positions is much increased and the hardness modification penetrates deeper into the specimen to at least 70 μm. The coated specimen shows greater microstructural change than in the previous test but the depth of penetration is no more than 20 μm and the degree of hardness modification even in this near-surface band is much less than the uncoated specimen exhibits.

FIG. 6 compares fatigue properties of an IMI 829 test pin coated as described with those of an uncoated IMI 829 control specimen. Each specimen was subjected to 1,000 hour exposure at 580° C. in air prior to fatigue testing to breaking point at room temperature. The coated test pieces clearly show a considerably improved performance relative to the uncoated test pieces.

EXAMPLE 2

Cylindrical test pins of IMI829 alloy were coated using sputter ion plating process from targets having the composition by weight of Ni-35Cr-8Al-8Si. The process used was as described by J. E. Restall and J. P. Coad at page 499 et seq in Metals Technology 9, 1982 save that the test pins were subject to an alternating positive/negative bias voltage for better control of coating distribution and microstructure. The depth of coating was approximately 50 μm which is too great to be representative of perceived gas turbine compressor coating needs so detailed results are not presented here. However, the density and adherence of the coatings prior to cyclic oxidation testing were comparable to those found for the Nimonic 75 coated documented in Example 1 and also the specimens when subjected to cyclic oxidation testing in the regime mentioned earlier showed no untoward effects.

I claim:

1. An article comprising a near —α titanium based alloy when coated with a high temperature oxidation and/or corrosion resistant coating, the coating being applied by a process selected from the group consisting of ion plating, sputter plating and sputter ion plating and comprising a nickel-chromium based alloy wherein the nickel and chromium in combination constitutes at least 75% by weight of the applied coating with a nickel to chromium ratio in the range 18:1 to 1.5:1 by weight.

2. An article as claimed in claim 1 in which the nickel-chromium based coating additionally comprises 2–12% by weight aluminium.

3. An article as claimed in claim 1 in which the nickel-chromium based coating additionally comprises 2–12% by weight silicon.

4. An article as claimed in claim 1 in which the nickel-chromium based coating additionally comprises up to 10% by weight iron.

5. An article as claimed in any one of the proceeding claims in which the nickel-chromium based alloy incorporates yttrium.

6. An article as claimed in claim 1 in which the nickel-chromium based alloy incorporates boron.

7. An article as claimed in claim 1 in which the nickel-chromium based alloy incorporates a rare earth element selected from the group consisting of lanthanum and cerium.

8. An article as claimed in claim 1 in which the nickel-chromium based alloy incorporates an element selected from the group of precious metals consisting of platinum, silver and rhodium.

* * * * *